United States Patent
Wang et al.

(10) Patent No.: US 6,782,942 B1
(45) Date of Patent: Aug. 31, 2004

(54) TABULAR HEAT PIPE STRUCTURE HAVING SUPPORT BODIES

(76) Inventors: Chin-Wen Wang, 4 F-3, No. 9, Hsin Fu I St., Ping Jen City, TaoYuan Hsien (TW); Ching Chung Wang, 14F, No. 9, Hsin Fu I St., Ping Jen City, Tao Yuan Hsien (TW); Pei-Choa Wang, 14F-3, No. 9, Hsin Fu I St., Ping Jen City, Tao Yuan Hsien (TW)

( * ) Notice: Subject to any disclaimer, the term of this patent is extended or adjusted under 35 U.S.C. 154(b) by 0 days.

(21) Appl. No.: 10/426,846

(22) Filed: May 1, 2003

(51) Int. Cl.[7] .............................................. F28D 15/00
(52) U.S. Cl. ........................... 165/104.26; 165/104.33; 165/185; 361/700; 174/15.2; 257/715
(58) Field of Search ....................... 165/104.26, 104.33, 165/185, 104.21; 361/700; 257/715; 174/15.2

(56) References Cited

U.S. PATENT DOCUMENTS

| | | | | |
|---|---|---|---|---|
| 3,680,189 A | * | 8/1972 | Noren ................... | 29/890.032 |
| 3,734,173 A | * | 5/1973 | Moritz .................. | 165/104.26 |
| 3,749,159 A | * | 7/1973 | Meijer .................. | 165/104.26 |
| 3,901,311 A | * | 8/1975 | Kosson et al. ......... | 165/104.26 |
| 4,046,190 A | * | 9/1977 | Marcus et al. ......... | 165/104.26 |
| 5,465,782 A | * | 11/1995 | Sun et al. .............. | 165/104.26 |
| 5,975,841 A | * | 11/1999 | Lindemuth et al. ......... | 415/114 |
| 6,269,866 B1 | * | 8/2001 | Yamamoto et al. ..... | 165/104.26 |
| 6,293,333 B1 | * | 9/2001 | Ponnappan et al. ..... | 165/104.26 |
| 6,410,982 B1 | * | 6/2002 | Brownell et al. ........... | 257/714 |
| 2001/0004934 A1 | * | 6/2001 | Yamamoto et al. ..... | 165/104.11 |
| 2002/0020518 A1 | * | 2/2002 | Li ......................... | 165/104.11 |

FOREIGN PATENT DOCUMENTS

| | | | | |
|---|---|---|---|---|
| JP | 58-96992 | * | 6/1980 | ............ 165/104.26 |
| JP | 2002-62067 | * | 7/1999 | ............ 165/104.26 |
| JP | 2001-339026 | * | 12/2001 | ............ 165/104.26 |
| JP | 11-183067 | * | 2/2002 | ............ 165/104.26 |

* cited by examiner

*Primary Examiner*—Terrell McKinnon
(74) *Attorney, Agent, or Firm*—Rosenberg, Klein & Lee

(57) ABSTRACT

A tabular heat pipe structure with support bodies has a housing, working fluid received in the housing and support bodies. The top and bottom faces of the support bodies are zigzag faces having a plurality of contact points. The support bodies use these contact points to adhere to the housing by means of welding. The tabular heat pipe structure is uniform and intact, has a high rigidity, will not cave in and deform due to back pressure in the heat pipe, and will not let the housing separate from the support bodies because of expansion at high temperatures. Therefore, the tabular heat pipe structure has the advantages like a better heat-conducting characteristic, a smaller contact heat resistance, a simple processing procedure, a quick manufacturing speed, a lower cost, and a simple and stable operation of flat adhesion.

5 Claims, 3 Drawing Sheets

US 6,782,942 B1

TABULAR HEAT PIPE STRUCTURE HAVING SUPPORT BODIES

FIELD OF THE INVENTION

The present invention relates to a tabular heat pipe structure having support bodies and, more particularly, to a tabular heat pipe structure having support bodies, which structure is disposed on a component emitting heat to conduct a large amount of heat generated by the component, and has a uniform and intact structure.

BACKGROUND OF THE INVENTION

Along with quick upgrade of the industry, operating speeds of various machines and information products increase day by day. Heat generated therewith also increase. In order to allow components in the machine to operate normally within permissible temperatures, various kinds of heat-radiating devices have been designed for components emitting a large amount of heat.

Under the requirement for compactness of today's products, a thin and flat tabular heat pipe has been developed. The tabular heat pipe comprises a housing, working fluid filling the housing and a support body. The support body is a metal net having capillary action. When the tabular heat pipe is disposed on a component emitting heat, the working fluid absorbs heat from the component and evaporates to the upper plane of the housing. Because the upper plane of the housing is a low-temperature, heat-radiating face, the vapor condenses into liquid and flows downwards along the support body. Heat radiation can thus be accomplished through repetitive cold and hot circulation in this way.

However, the above conventional tabular heat pipe may easily cave in and deform due to back pressure, and has drawbacks such as a poor heat-conducting ability, a larger contact heat resistance, an unstable capillary structure, a difficult processing procedure, a high cost, a low manufacturing speed, difficulty in flat adhesion of the capillary structure, and cumbersome point welding. Moreover, the support body only fills the housing. When operating in a high-temperature environment, the tabular heat pipe may easily expand to cause a loose adhesion of the support body in the housing. Therefore, the condensed working fluid cannot flow downwards along the support body. Instead, it is necessary for the condensed working fluid to condense into large drops and then fall down due to gravity, hence greatly reducing the heat-radiating efficiency of the tabular heat pipe.

Accordingly, the above conventional tabular heat pipe has inconveniences and drawbacks in practical use. The present invention aims to solve the problems in the prior art.

SUMMARY OF THE INVENTION

The primary object of the present invention is to provide a tabular heat pipe structure having support bodies, which structure is uniform and intact, has a high rigidity, will not cave in and deform due to back pressure in the heat pipe, and will not let a housing separate from the support bodies because of expansion at high temperatures. Therefore, the tabular heat pipe structure has the advantages such as a better heat-conducting ability, a smaller contact heat resistance, a simple processing procedure, a low cost, a quick manufacturing speed, and a simple and stable process of flat adhesion.

To achieve the above object, the present invention provides a tabular heat pipe structure having support bodies, which structure comprises a housing, working fluid received in the housing and support bodies. The top and bottom faces of the support bodies are zigzag faces having a plurality of contact points. The support bodies use these contact points to adhere to the housing by means of welding.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 1:
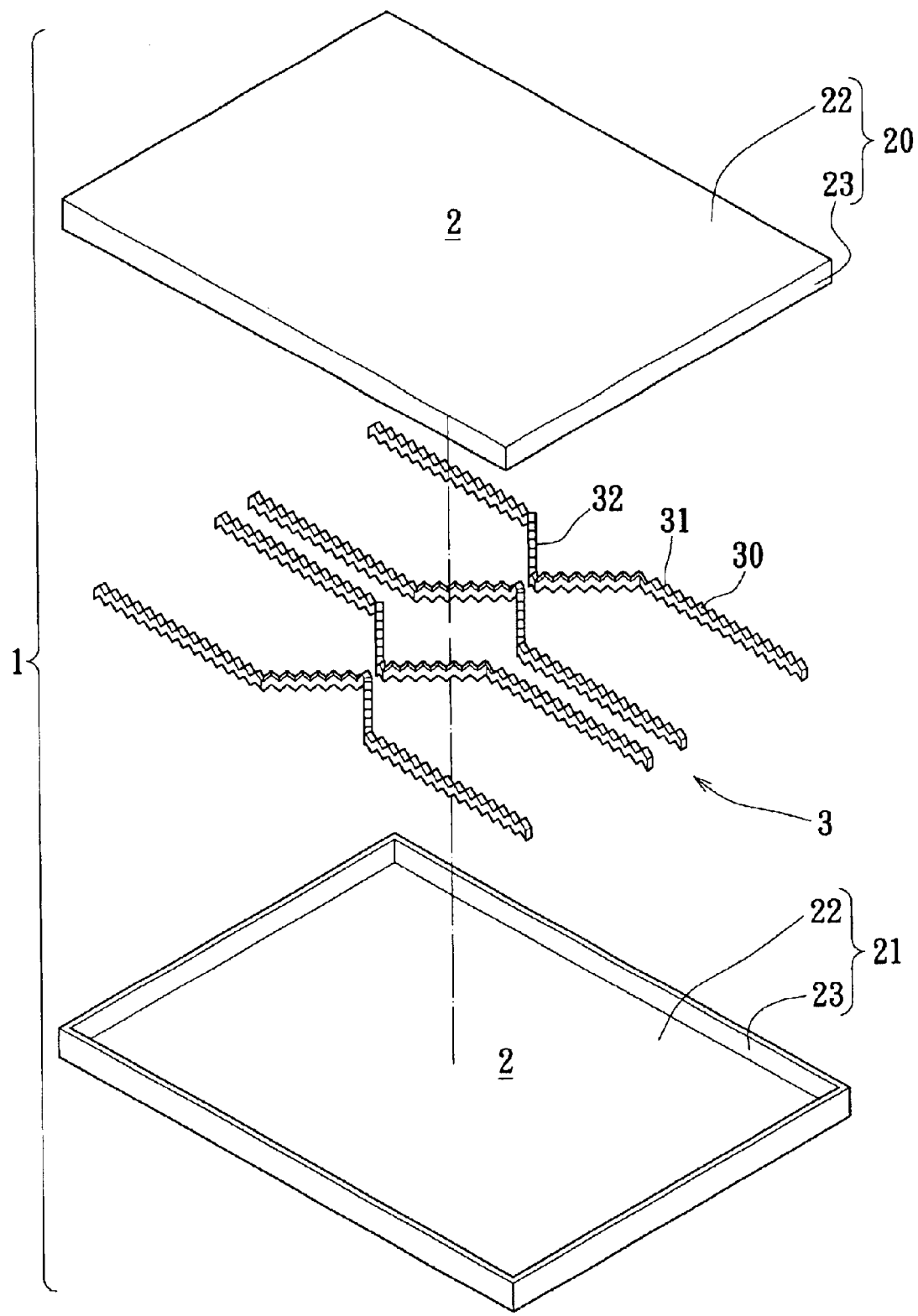
FIG. 1 is an exploded perspective view of a tabular heat pipe structure having support bodies of the present invention.
Figure 2:
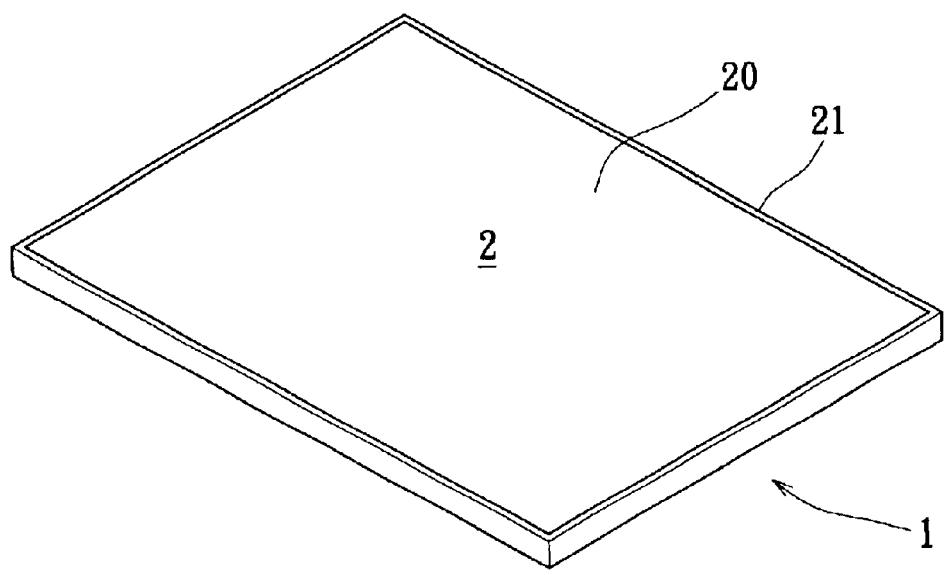
FIG. 2 is a perspective view of a tabular heat pipe structure having support bodies of the present invention.
Figure 3:
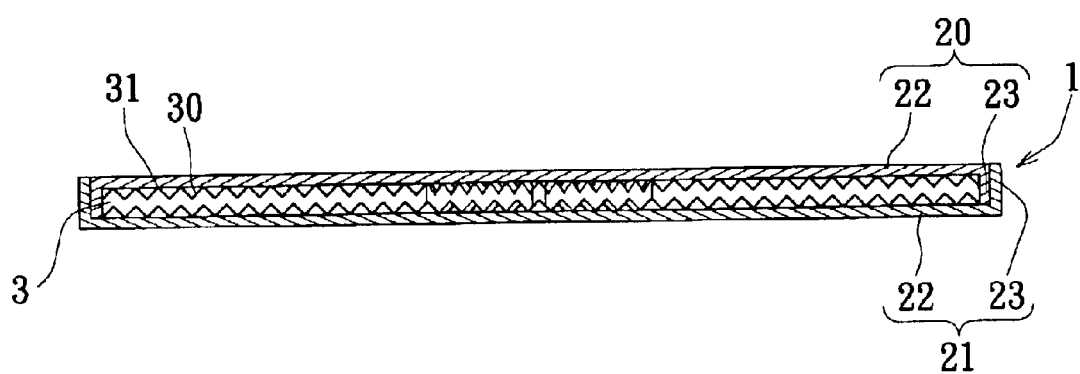
FIG. 3 is a cross-sectional view of a tabular heat pipe structure having support bodies of the present invention.

As shown in FIGS. 1 to 3, the present invention provides a tabular heat pipe structure having support bodies. The tabular heat pipe 1 comprises a housing 2, working fluid (not shown) received in the housing 2, and support bodies 3. Because the working fluid is the same as that in the prior art, it will not be further described below.

The housing 2 is made of a metal sheet having a good thermal conductivity by punching. The housing 2 is composed of an upper shell body 20 and a lower shell body 21. The upper shell body 20 has a downward opening, which comprises a flat bottom 22 and a,wall 23 extending from the periphery of the bottom 22. The lower shell body 21 has an upward opening corresponding to the downward opening of the upper shell body 20. The upward opening comprises a flat bottom 22 and a wall 23 extending from the periphery of the bottom 22. The bottom 22 of the upper shell body 20 is slightly smaller than the bottom 22 of the lower shell body 21 so that the upper shell body 20 can be tightly covered in the lower shell body 21.

The support bodies 3 are a plurality of strips of metal having a good thermal conductivity. The upper and lower faces thereof are cut into zigzag faces 30, which have a plurality of sharp contact points 31. The middle of each of the support bodies 3 has a V-shaped bent portion 32. In this embodiment, there are four support bodies 3 having bent portions 32. The tips of the bent portions 32 of these support bodies 3 are arranged to be opposite one another, as shown in FIG. 1. The support bodies 3 use the contact point 31 to adhere to and be received in the housing 2 by means of welding. The tabular heat pipe structure having support bodies of the present invention is thus formed.

Figure 4:
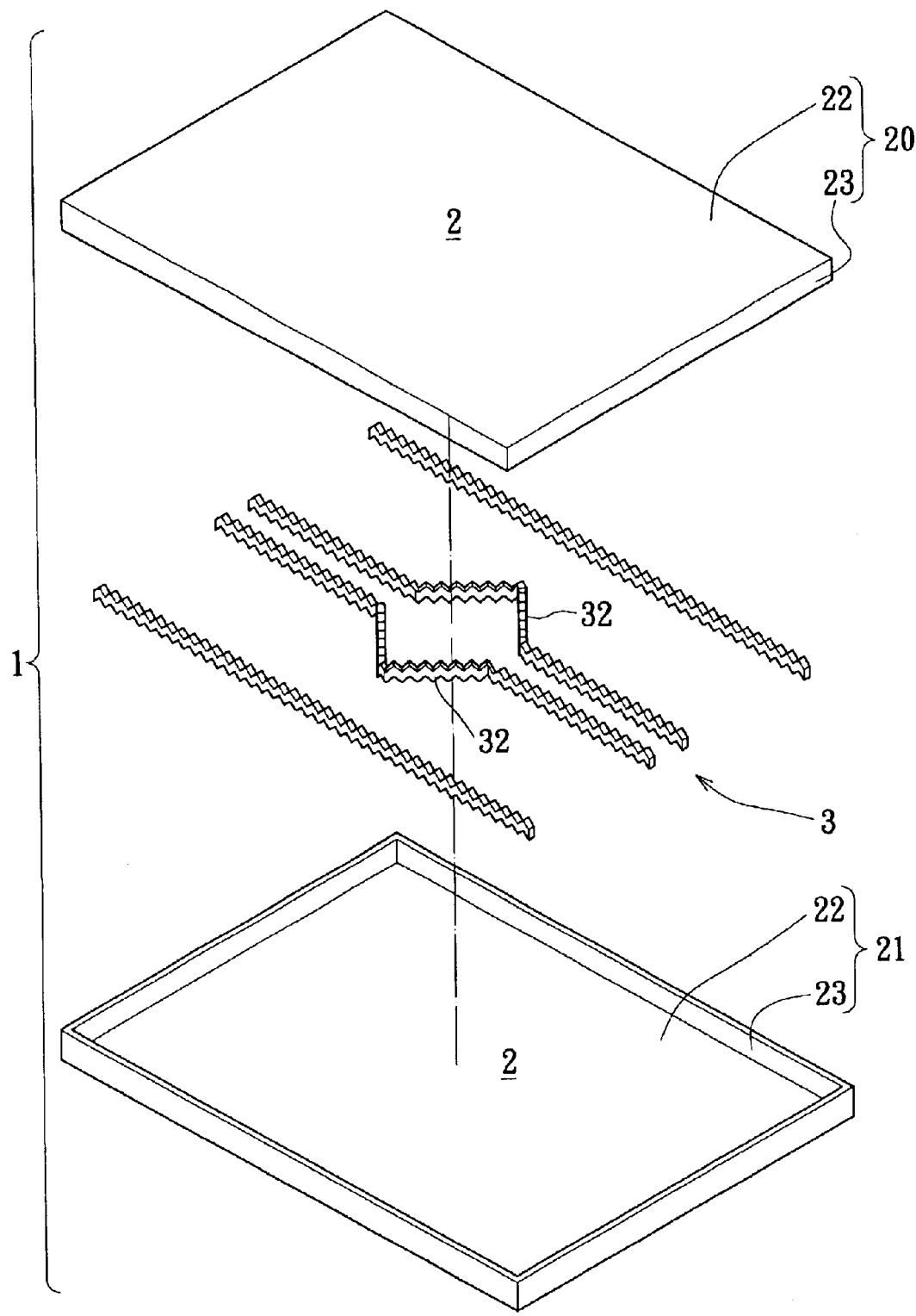
FIG. 4 is an exploded perspective view of a tabular heat pipe structure having support bodies according to another embodiment of the present invention.

FIG. 4 is an exploded perspective view of a tabular heat pipe structure having support bodies according to another embodiment of the present invention. The support bodies 2 are composed of two straight strips of metal and two strips of metal having bent portions. The two support bodies 3 having bent portions 32 are disposed near the middle of the bottom 22 of the housing 2. The tips of the bent portions 32 are arranged to face outwards. The two straight support bodies 3 are disposed outside the two support bodies 3 having the bent portions 32, respectively.

Because the support bodies have many sharp contact points, they have a better heat-conducting characteristic, and can speed up condensation of the working fluid and then guide it to flow to the heat source. The support bodies can replace the support body in the conventional tabular heat pipe. The tabular heat pipe structure having support bodies of the present invention also has the advantages of a simple construction procedure, a low cost, a fast manufacturing speed, a dense and firm structure, and a high and uniform rigidity. Therefore, the housing will not easily cave in and deform due to back pressure in the heat pipe. Moreover, because the support bodies use the contact points to adhere to the housing by means of welding, they have the advantage of simple and stable operation of flat adhesion. The housing will not separate from the support bodies due to expansion at high temperatures. The housing can also be integrally formed by punching. That is, it can be mass-produced and easily constructed.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A tabular heat pipe structure having support bodies, comprising:

a housing, said housing being composed of an upper shell body and a lower shell body, said upper shell body having a downward opening comprising a flat bottom and a wall extending from a periphery of said bottom, said lower shell body having an upward opening corresponding to said downward opening of said upper shell body, said upward opening comprising a flat bottom and a wall extending from the periphery of said bottom of said lower shell body, and said bottom of said upper shell body being slightly smaller than said bottom of said lower shell body so that said upper shell body can be tightly covered in said lower shell body;

a working fluid received in said housing; and a plurality of support bodies, wherein upper and lower faces of each of said support bodies have zigzag faces with a plurality of contact points, said contact points being used to respectively adhere said support bodies to said housing by means of welding.

2. A tabular heat pipe structure having support bodies, comprising:

a housing;

a working fluid received in said housing; and a plurality of support bodies, wherein upper and lower faces of each of said support bodies have zigzag faces with a plurality of contact points, said contact points being used to respectively adhere said support bodies to said housing by means of welding, said support bodies are cut into zigzag faces with cutting tools to form said sharp contact points.

3. A tabular heat pipe structure having support bodies, comprising:

a housing;

a working fluid received in said housing; and a plurality of support bodies, wherein upper and lower faces of each of said support bodies have zigzag faces with a plurality of contact points, said contact points being used to respectively adhere said support bodies to said housing by means of welding, said plurality of support bodies being respectively formed by a plurality of long strips of metal having a rood thermal conductivity, a middle of at least a portion of said support bodies being formed with a V-shaped bent portion.

4. The tabular heat pipe structure having support bodies as claimed in claim 3, wherein said support bodies are composed of four parallel strips of metal having said V-shaped bent portions, and tips of said bent portions are arranged to be opposite one another.

5. The tabular heat pipe structure having support bodies as claimed in claim 3, wherein said support bodies are composed of two straight strips of metal and two strips of metal having said bent portions, said two support bodies having said bent portions are disposed near the middle of the bottom of said housing, tips of said bent portions are arranged to face outwards, and said two straight support bodies are respectively disposed outside said two support bodies having said bent portions.

* * * * *